(12) United States Patent
Rao

(10) Patent No.: US 8,106,481 B2
(45) Date of Patent: Jan. 31, 2012

(54) SEMICONDUCTOR DEVICES WITH GRADED DOPANT REGIONS

(76) Inventor: G. R. Mohan Rao, McKinney, TX (US)

( * ) Notice: Subject to any disclaimer, the term of this patent is extended or adjusted under 35 U.S.C. 154(b) by 0 days.

(21) Appl. No.: 12/549,283

(22) Filed: Aug. 27, 2009

(65) Prior Publication Data
US 2010/0006138 A1  Jan. 14, 2010

Related U.S. Application Data

(63) Continuation-in-part of application No. 10/934,915, filed on Sep. 3, 2004, now abandoned.

(51) Int. Cl.
*H01L 21/22* (2006.01)
(52) U.S. Cl. ............. 257/558; 257/404; 257/E29.053
(58) Field of Classification Search .......... 257/369, 257/558
See application file for complete search history.

(56) References Cited

U.S. PATENT DOCUMENTS
2001/0028097 A1* 10/2001 Matsuoka et al. ........... 257/506
2004/0063288 A1* 4/2004 Kenney et al. ............... 438/301

FOREIGN PATENT DOCUMENTS
EP        1078761 A2 *  2/2001

* cited by examiner

*Primary Examiner* — Ajay K Arora
(74) *Attorney, Agent, or Firm* — Eugene M. Cummings, P.C.

(57) ABSTRACT

Most semiconductor devices manufactured today, have uniform dopant concentration, either in the lateral or vertical device active (and isolation) regions. By grading the dopant concentration, the performance in various semiconductor devices can be significantly improved. Performance improvements can be obtained in application specific areas like increase in frequency of operation for digital logic, various power MOSFET and IGBT ICS, improvement in refresh time for DRAM's, decrease in programming time for nonvolatile memory, better visual quality including pixel resolution and color sensitivity for imaging ICs, better sensitivity for varactors in tunable filters, higher drive capabilities for JFET's, and a host of other applications.

21 Claims, 21 Drawing Sheets

(CMOS integrated circuit built on 2-way graded dopant epitaxial layer.)

(Prior Art – Twin well CMOS for a CMOS integrated circuit)

(Prior Art – Two-device EEPROM memory cell)

(Prior Art – 1T-1C DRAM memory cell)

[Prior Art – NAND flash memory cell]

Note: Control/Select transistors have a single insulator – traditional MOS transistor.
Storage nodes have a stacked gate structure, typically with a floating gate and control gate comprising the stack.

(IGBT having a graded dopant n⁻ epitaxial drift region.)

(CMOS substrate for digital, mixed, signal and sensor ICs.)

(CMOS substrate for a DRAM or image sensor.)

(CMOS substrate for a NAND flash device to improve programming times.)

(CMOS integrated circuit implementing graded dopants in wells, isolation regions and active regions. Graded dopant of "one kind" creates either aiding or retarding field.)

(CMOS integrated circuit built on graded dopant epitaxial layer, graded dopant wells and STI isolation regions. Graded dopant of "one kind" creates either aiding or retarding implementing graded dopants in wells, isolation regions and active regions. Graded dopant of "one kind" creates either aiding or retarding field.)

(CMOS integrated circuit implementing graded dopants creating both aiding and retarding fields.)

(CMOS integrated circuit built on 2-way graded dopant epitaxial layer.)

(CMOS integrated circuit implementing graded dopants in wells, isolation regions and active regions. Graded dopants creating both aiding and retarding fields.)

(CMOS integrated circuit built on graded dopant epitaxial layer, graded dopant wells and STI isolation regions. 2-way graded dopants in epitaxial region (layer) create both aiding and retarding fields. Graded dopants in well regions are of "one kind" and create either aiding or retarding field.)

(CMOS integrated circuit implementing 2-way graded dopants in well regions and substrate creating both aiding and retarding fields.)

(CMOS integrated circuit built on 2-way graded dopant epitaxial layer. Uniformly doped substrate.)

(Photovoltaic panel employing "graded dopant" material and a microcontroller mounted or fabricated together.)

(Photovoltaic panel employing "graded dopant" material for both PV panel and power device.)

(Photovoltaic panel employing "graded dopant" material integrated with a microcontroller and a power device.)

SEMICONDUCTOR DEVICES WITH GRADED DOPANT REGIONS

CROSS-REFERENCE TO RELATED APPLICATION

This application is a Continuation-in-Part of U.S. application Ser. No. 10/934,915, filed on Sep. 3, 2004 now abandoned, which application is incorporated herein by reference.

FIELD OF INVENTION

This present invention relates to all semiconductor devices and systems. Particularly it applies to diffused diodes, avalanche diodes, Schottky devices, power MOS transistors, JFET's, RF bipolar transistors, IGBTs (Insulated Gate Bipolar Transistors), varactors, digital VLSI, mixed signal circuits and sensor devices including camera ICs employing CCD (Charge Coupled Device) as well as CMOS technologies.

BACKGROUND OF INVENTION

Bipolar Junction Transistors (BJT) are classified as minority carrier devices because minority carriers are the principle device conduction mechanism. However, majority carriers also play a small but finite role in modulating the conductivity in BJTs. Consequently, both carriers (electrons and holes) play a role in the switching performance of BJTs. The maximum frequency of operation in BJTs is limited by the base transit time as well as the quick recombination of the majority carriers when the device is switched off (prior to beginning the next cycle). The dominant carrier mechanism in BJTs is carrier diffusion. The carrier drift current component is fairly small, especially in uniformly doped base BJTs. Efforts have been made in graded base transistors to create an aiding drift field to enhance the diffusing minority carrier's speed from emitter to collector. However, most semiconductor devices, including various power MOSFETs (traditional, DMOS, lateral, vertical and a host of other configurations), IGBTs (Insulated Gated Base Transistors), still use a uniformly doped drift epitaxial region in the base. FIG. 1 shows the relative doping concentration versus distance in a BJT. FIG. 2 shows the uniformly doped epi region in an IGBT. In contrast to BJTs, MOS devices are majority carrier devices for conduction. The conduction is channel dominated. The channel can be a surface in one plane in planar devices. The surface can also be on the sidewalls in a vertical device. Other device architectures to combine planar and vertical conductions are also possible. The maximum frequency of operation is dictated primarily by source-drain separation distance. Most MOS devices use a uniformly doped substrate (or a well region). When a MOSFET is optimally integrated with a BJT in a monolithic fashion, an IGBT results. The IGBT inherits the advantages of both MOSFET and BJT. It also brings new challenges because the required characteristics (electron transit and hole recombination as fast as possible in n-channel IGBT) necessitate different dopant gradients either in the same layer at different positions, or at the interfaces of similar or dissimilar layers.

Retrograde wells have been attempted, with little success, to help improve soft error immunity in SRAMs and visual quality in imaging circuits. FIG. 3(a) shows a typical CMOS VLSI device employing a twin well substrate, on which active devices are subsequently fabricated. FIGS. 3(b), 3(c), and 3(d) illustrate device cross sections, as practiced today. Retrograde and halo wells have also been attempted to improve refresh time in DRAMs (dynamic random-access memories), as well as, reducing dark current (background noise) and enhance RGB (Red, Green, Blue) color resolution in digital camera ICs. Most of these techniques either divert the minority carriers away from the active regions of critical charge storage nodes at the surface, or, increase minority carrier density locally as the particular application requires.

BRIEF DESCRIPTION OF DRAWINGS

For a more complete understanding of the present invention, and the advantages thereof, reference is now made to the following descriptions taken in conjunction with the accompanying drawings, in which:

FIG. 3(a) showing a typical prior art IC with two wells (one n⁻well in which p-channel transistors are subsequently fabricated and one p⁻well in which n-channel transistors are subsequently fabricated); FIG. 3(b) showing a prior art EEPROM (Electrically Erasable Programmable Read-Only Memory) memory cell having a tunnel insulator; FIG. 3(c) showing a prior art DRAM memory cell; and FIG. 3(d) showing a prior art NAND flash memory cell;

DETAILED DESCRIPTION OF THE INVENTION

The relative doping concentrations of emitter and collector regions varies from $10^{18}$ to $10^{20}/cm^3$, whereas the base region is $10^{14}$ to $10^{16}/cm^3$ depending on the desired characteristics of the BJT. In graded base p-n-p transistors, the donor dopant concentration may be 10 to 100× at the emitter-base junction, relative to the base-collector junction (1×). The gradient can be linear, quasi linear, exponential or complimentary error function. The relative slope of the donor concentration throughout the base creates a suitable aiding drift electric field, to help the holes (p-n-p transistor) transverse from emitter to collector. Since the aiding drift electric field helps hole conduction, the current gain at a given frequency is enhanced, relative to a uniformly-doped (base) BJT. The improvement in cut-off frequency (or, frequency at unity gain, $f_T$) can be as large as 2×-5×. Similar performance improvements are also applicable to n-p-n transistors.

Figure 1:
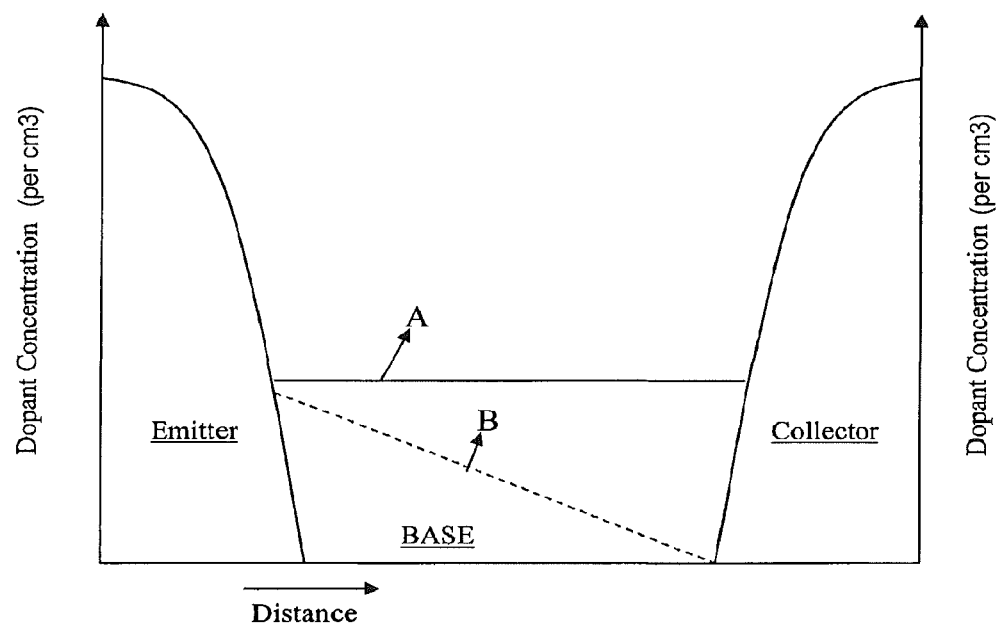
FIG. 1 illustrates the relative doping profiles of emitter, base and collector for the two most popular bipolar junction transistors: namely, uniform base ("A") and graded base ("B")
Figure 2:
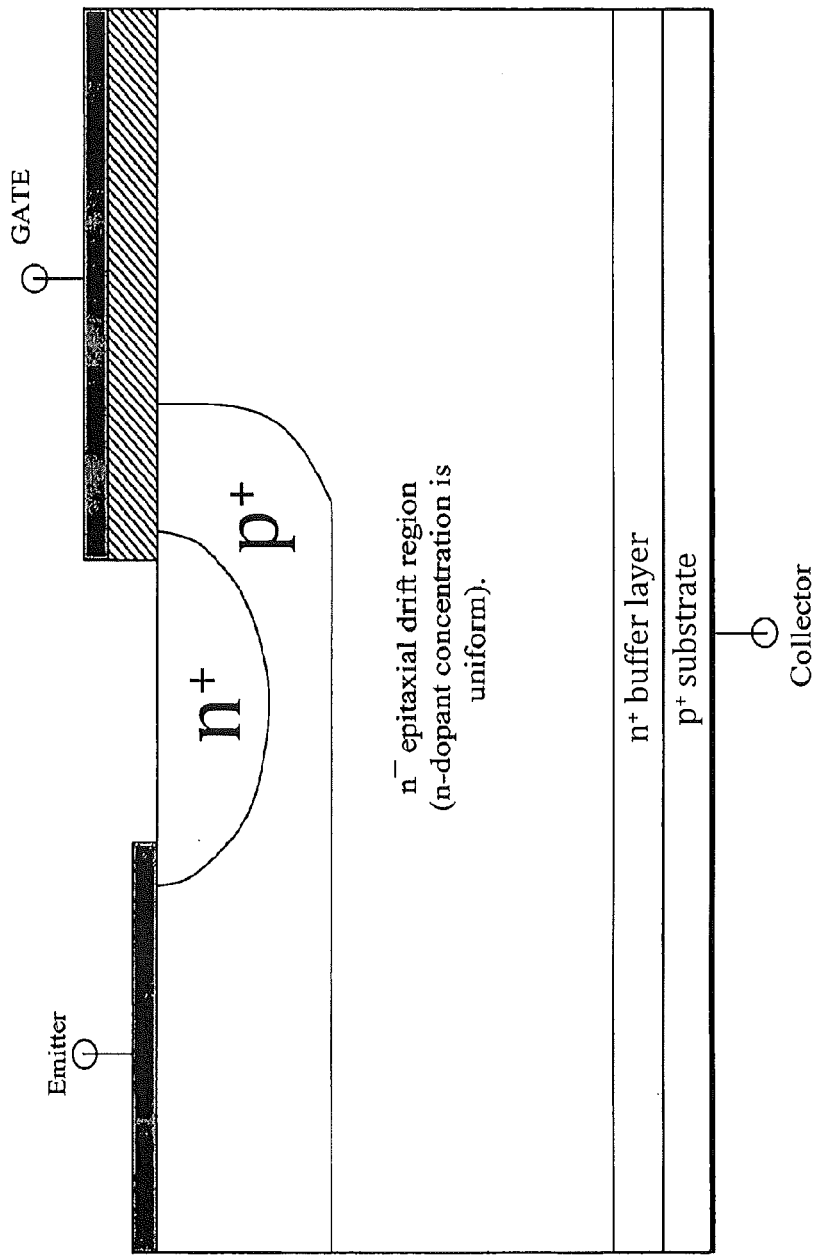
FIG. 2 illustrates the cross section of a commercial IGBT with a uniform epitaxial drift region (base)
Figure 3A:
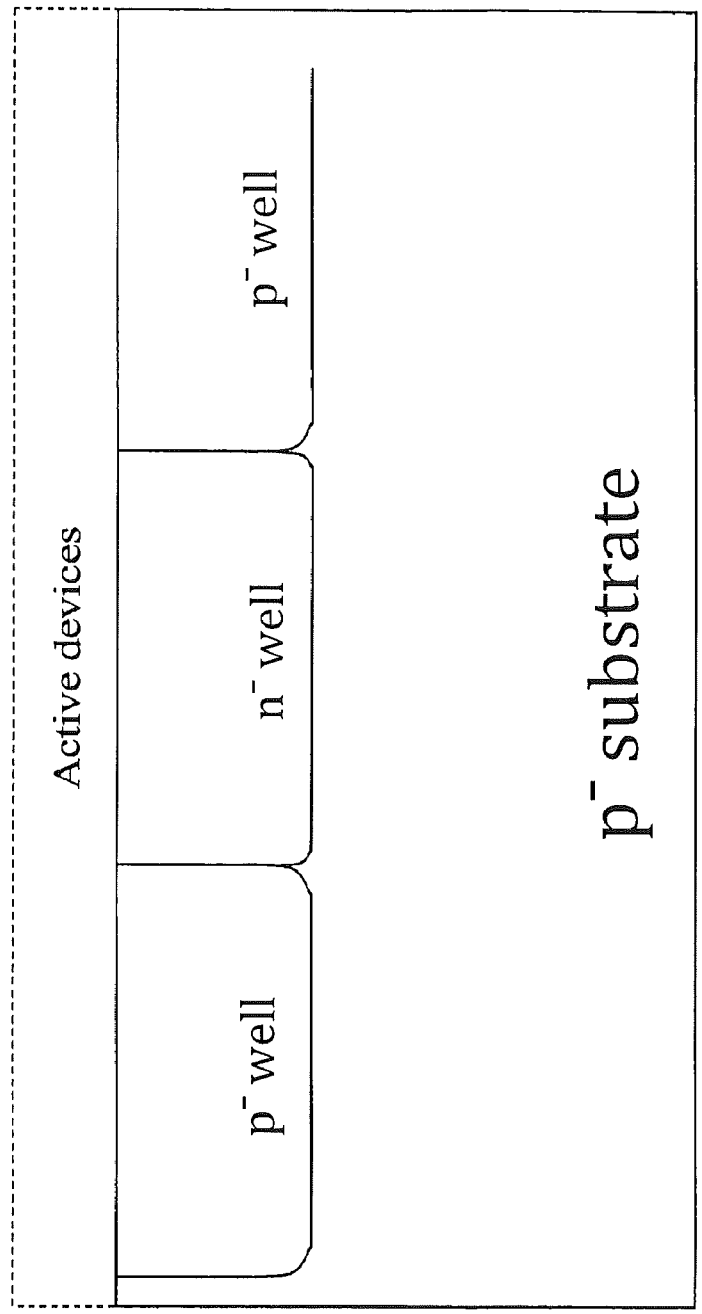
FIGS. 3(a), 3(b), 3(c), and 3(d) illustrate cross sections of commonly used prior art CMOS silicon substrates.
Figure 3B:
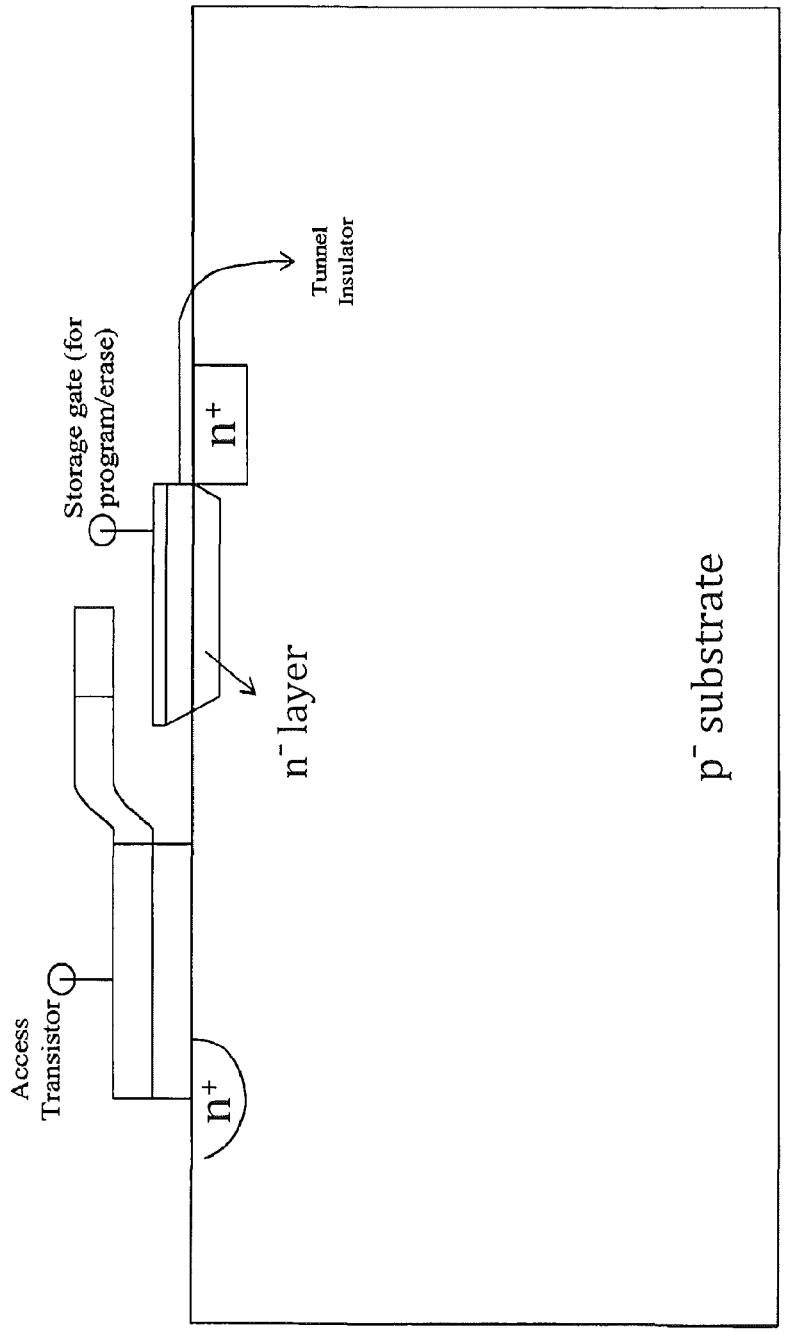
Figure 3C:
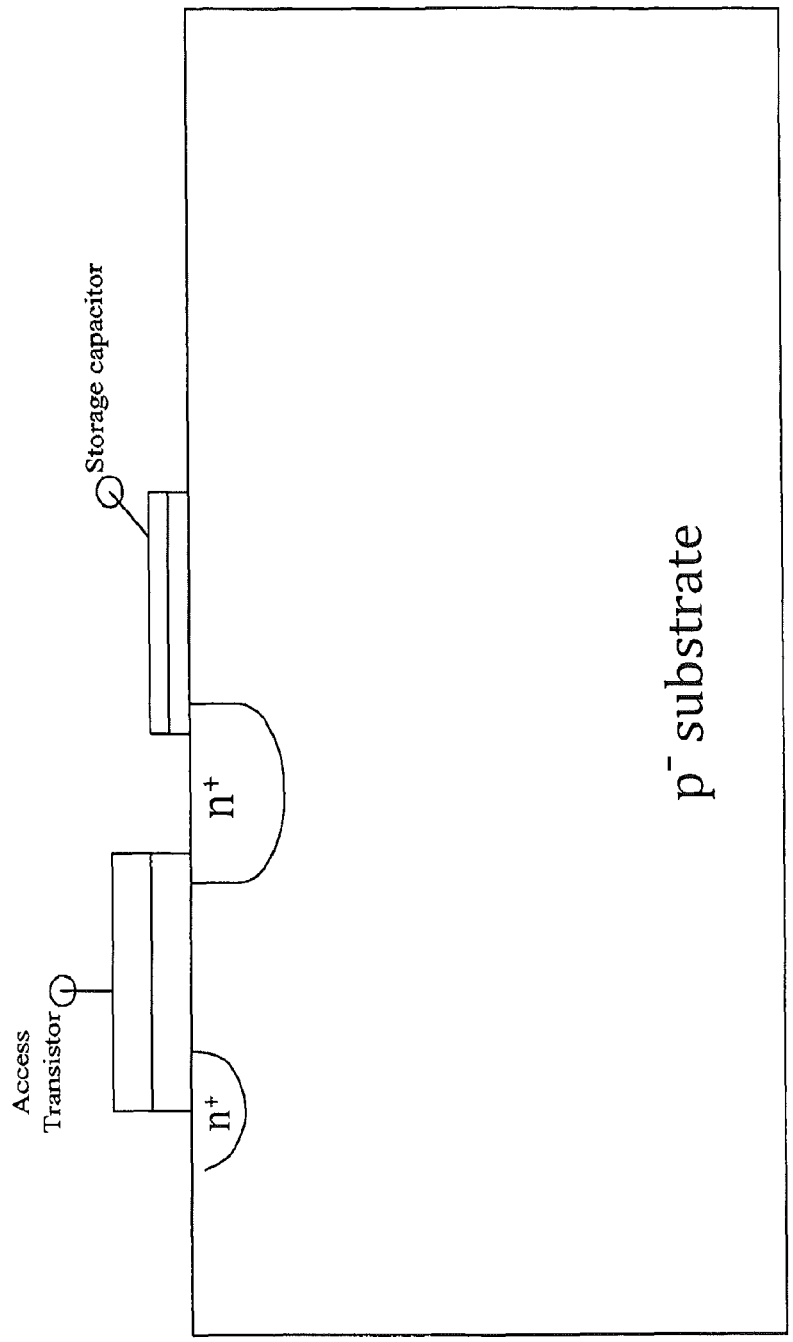
Figure 3D:
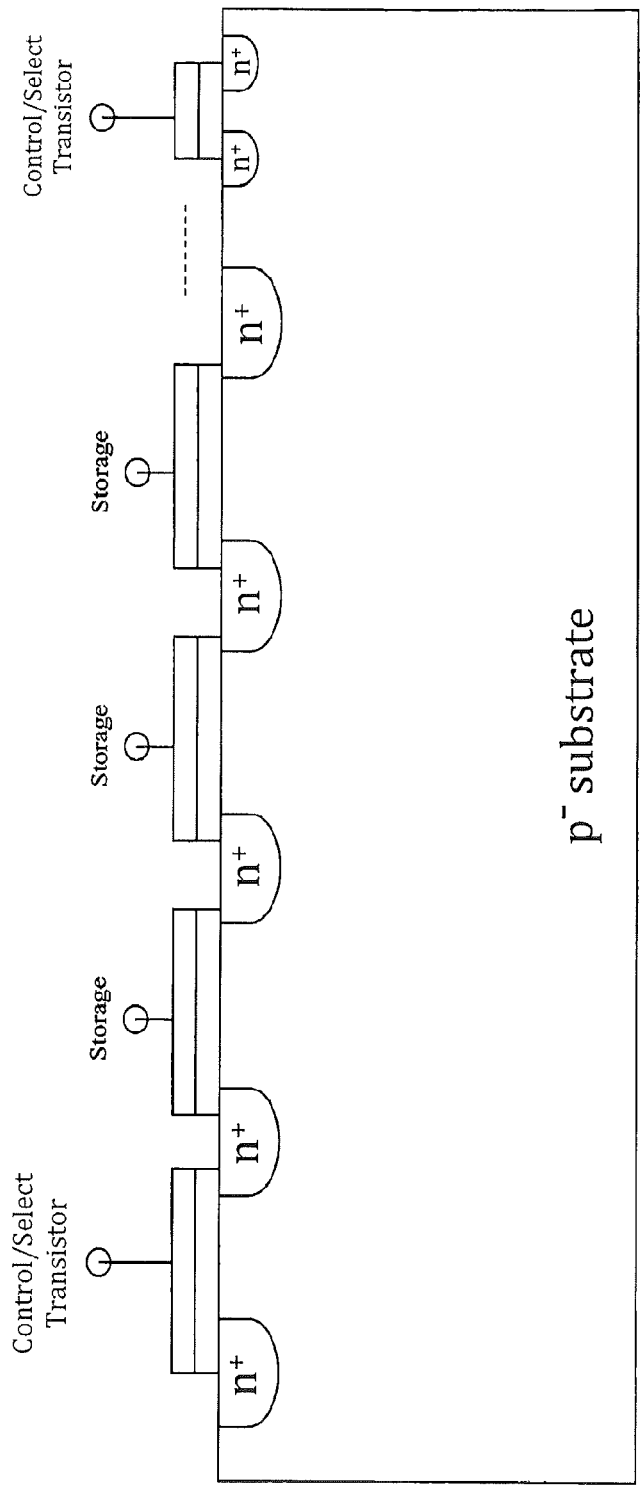
Figure 4:
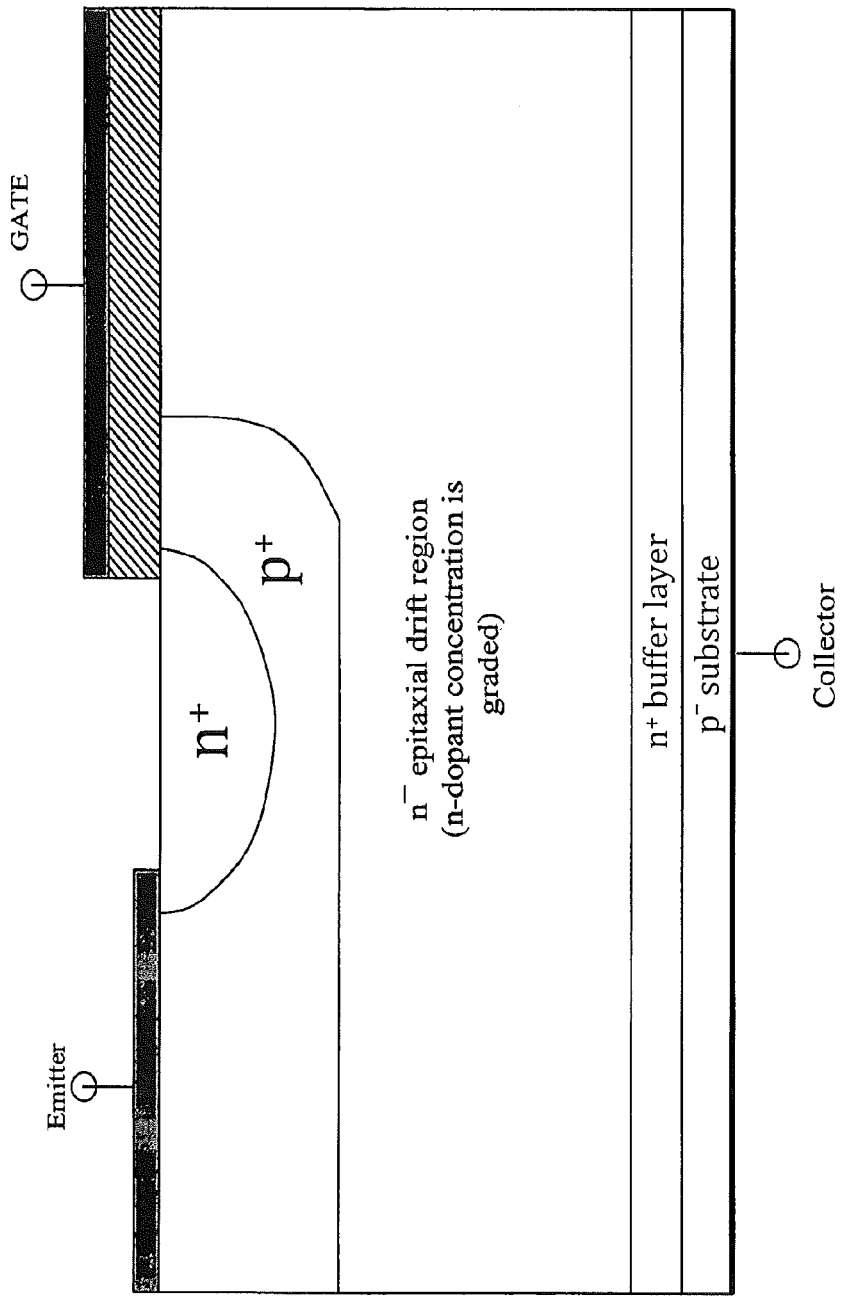
FIG. 4 illustrates the cross section of IGBT, using one embodiment of the invention described here, where the dopant is optimally graded in the epitaxial drift region.

As illustrated in FIG. 4, in one embodiment according to the invention, a donor gradient is established from the emitter-drift epitaxial base region junction of the punch-through IGBT, to the drift epitaxial base region—$n^+$ buffer layer boundary (electrons in this case are accelerated in their transit from emitter to collector). The "average" base resistance is optimized so that conductivity modulation and lifetime (for minority carriers) in the base region are not compromised. By sweeping the carriers towards the $n^+$ buffer region a number of advantages are obtained. First, the frequency of operation (combination of $t_{on}$ and $t_{off}$ as is known in the IGBT commercial nomenclature) can be enhanced. Second, and maybe more importantly, during $t_{off}$, holes can be recombined much quicker at the $n^+$ buffer layer, compared to the uniformly doped $n^-$ epitaxial drift region by establishing a different dopant gradient near the n+ buffer layer. It should be noted that the drift region can also be a non-epitaxial silicon substrate. Although epitaxy enhances lifetime, it is not mandatory. Different layers of dopant regions can be transferred through wafer to wafer bonding (or other similar transfer mechanisms) for eventual device fabrication. The "reverse recovery time" for an IGBT is significantly improved due to the optimized graded dopant in the so called "drift region" as well as at the interfaces of the drift region. Graded dopants can also be implemented in the n+ buffer layer as well as other regions adjacent to the respective layers. Two important performance enhancements are the result of dopant gradients. For example, in an n-channel IGBT, electrons can be swept from source to drain rapidly, while at the same time holes can be recombined closer to the n+ buffer layer. This can improve $t_{on}$ and $t_{off}$ in the same device.

Figure 5A:
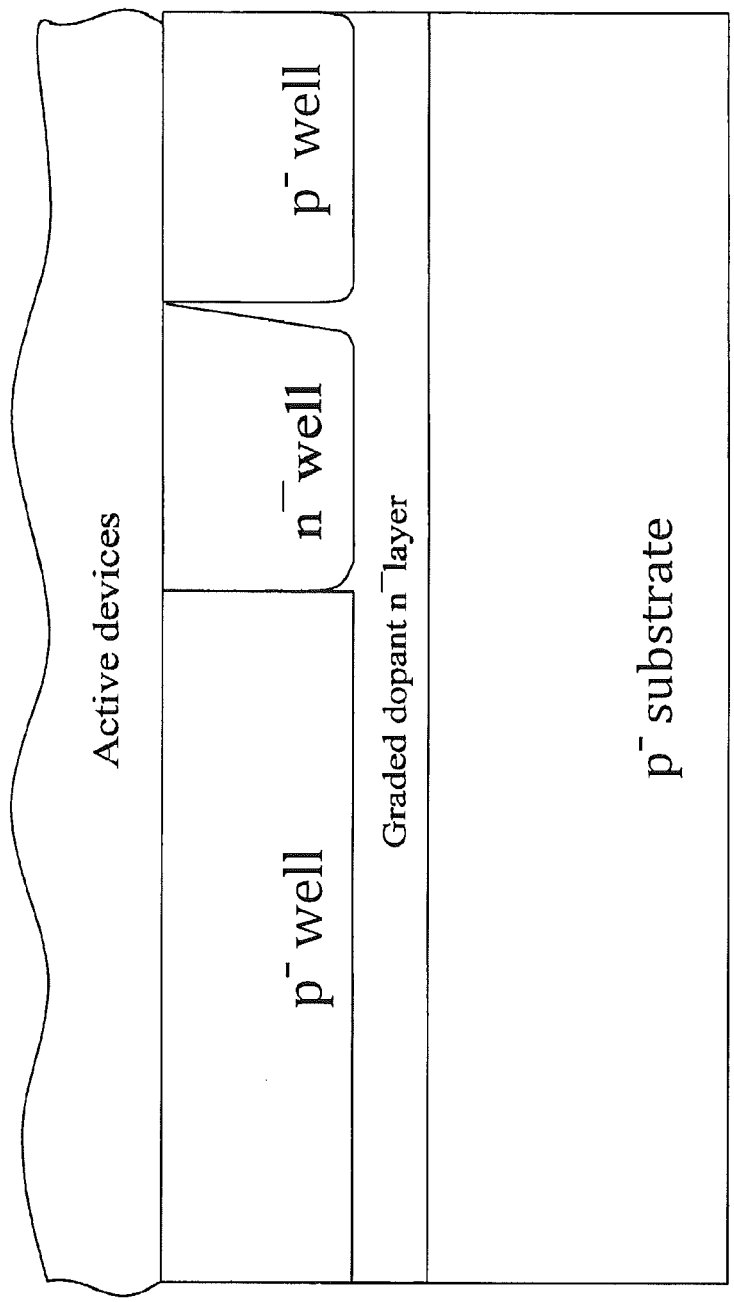
FIGS. 5(a), 5(b), and 5(c) illustrate the cross sections of a CMOS silicon substrate with two wells and an underlying layer using embodiments of the invention to improve performance in each application—VLSI logic, DRAM/image IC, nonvolatile memory IC.
Figure 5B:
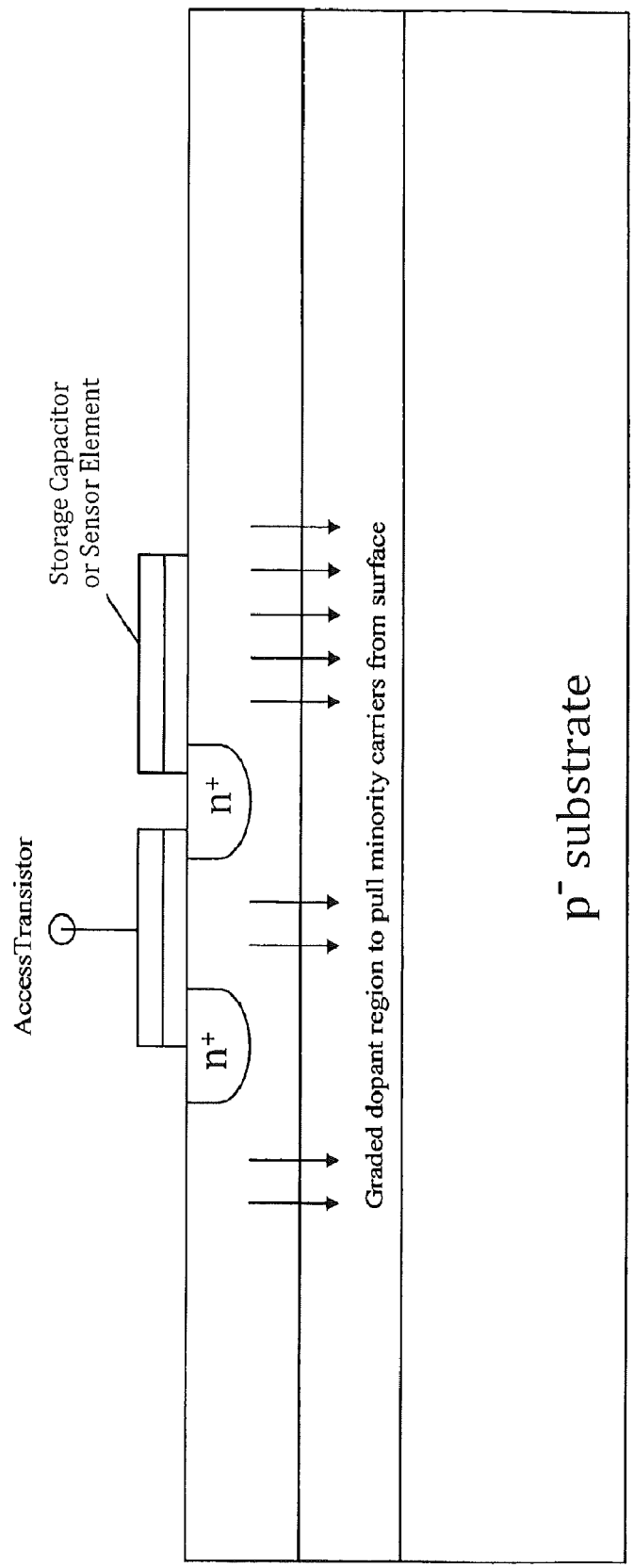
Figure 5C:
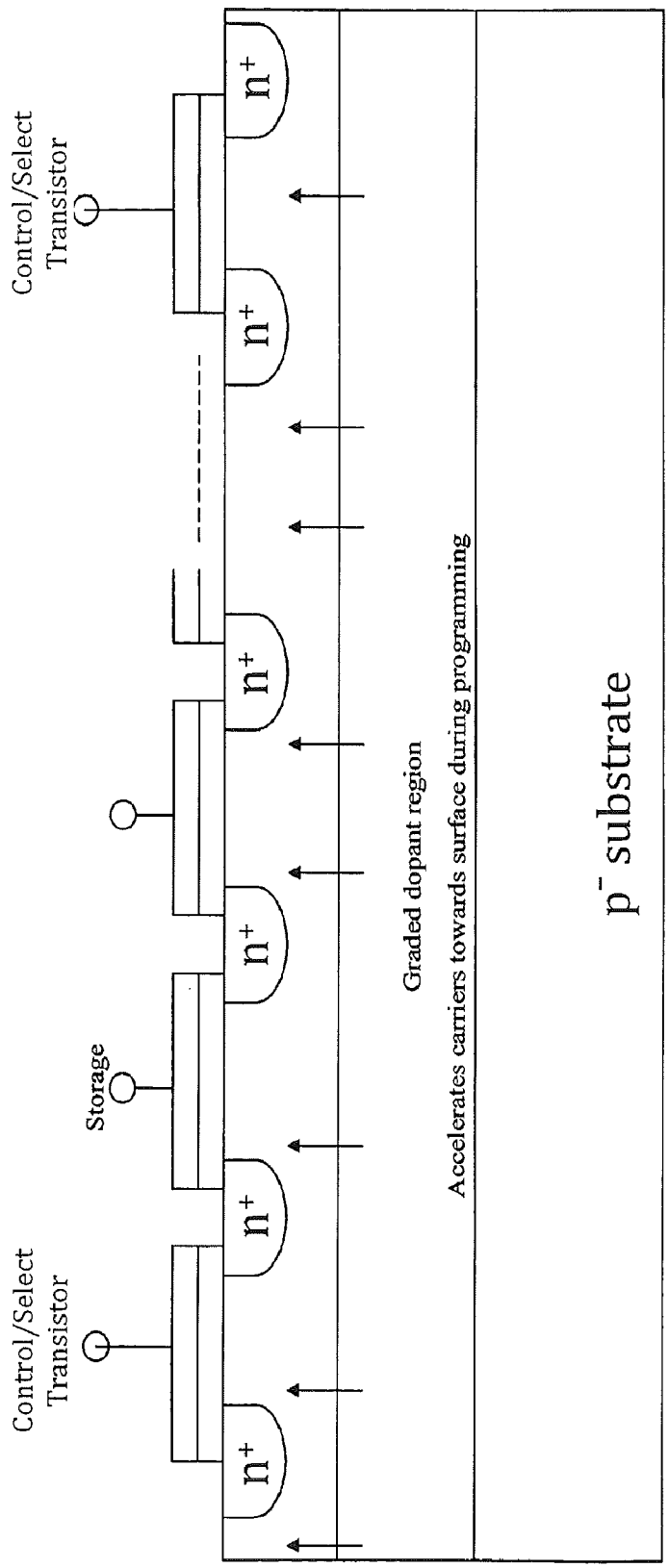
Figure 6:
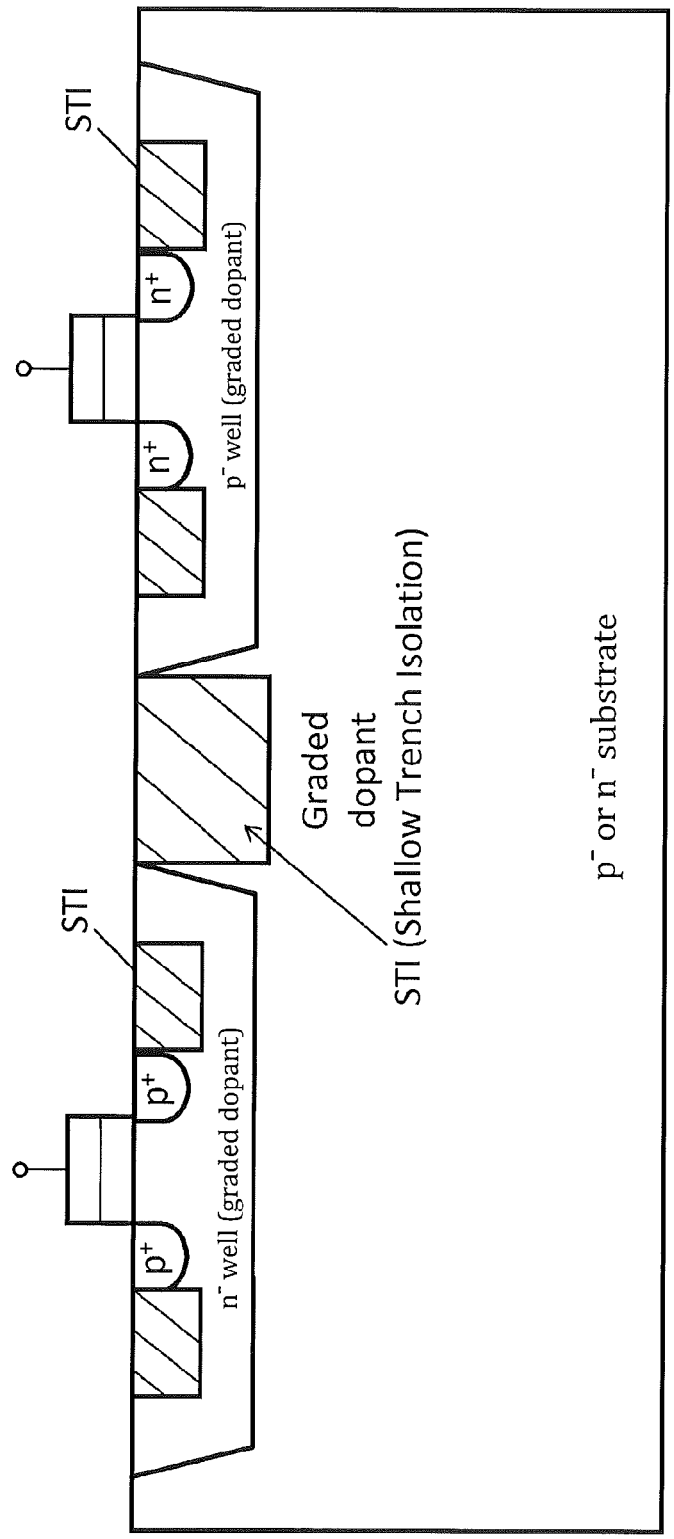
FIG. 6 shows a typical CMOS integrated circuit. The p-channel transistor is situated (fabricated) in an n⁻well, while the n-channel transistor is situated in a p⁻well. The wells are separated by a STI (Shallow Trench Isolation) for isolation. This is a typical structure for a CMOS VLSI IC fabricated on a uniformly doped p⁻ or n⁻ substrate. As one embodiment of the invention, each of the n⁻well and p⁻well has their respective graded dopants in the well regions. The n⁻well has a graded dopant to "sweep" away the holes from the surface towards the interfaces of the n⁻well and the uniformly doped substrate. As an exemplary performance improvement of the switching time of the p-channel transistor, its "off" time will be significantly improved. With an analogous graded dopant in the p⁻well, the n-channel transistor's switching performance can also be improved. A DRAM memory cell which dynamically holds an electrical charge, for example in a p⁻well with graded dopant, can have an improved refresh time characteristic.
Figure 7:
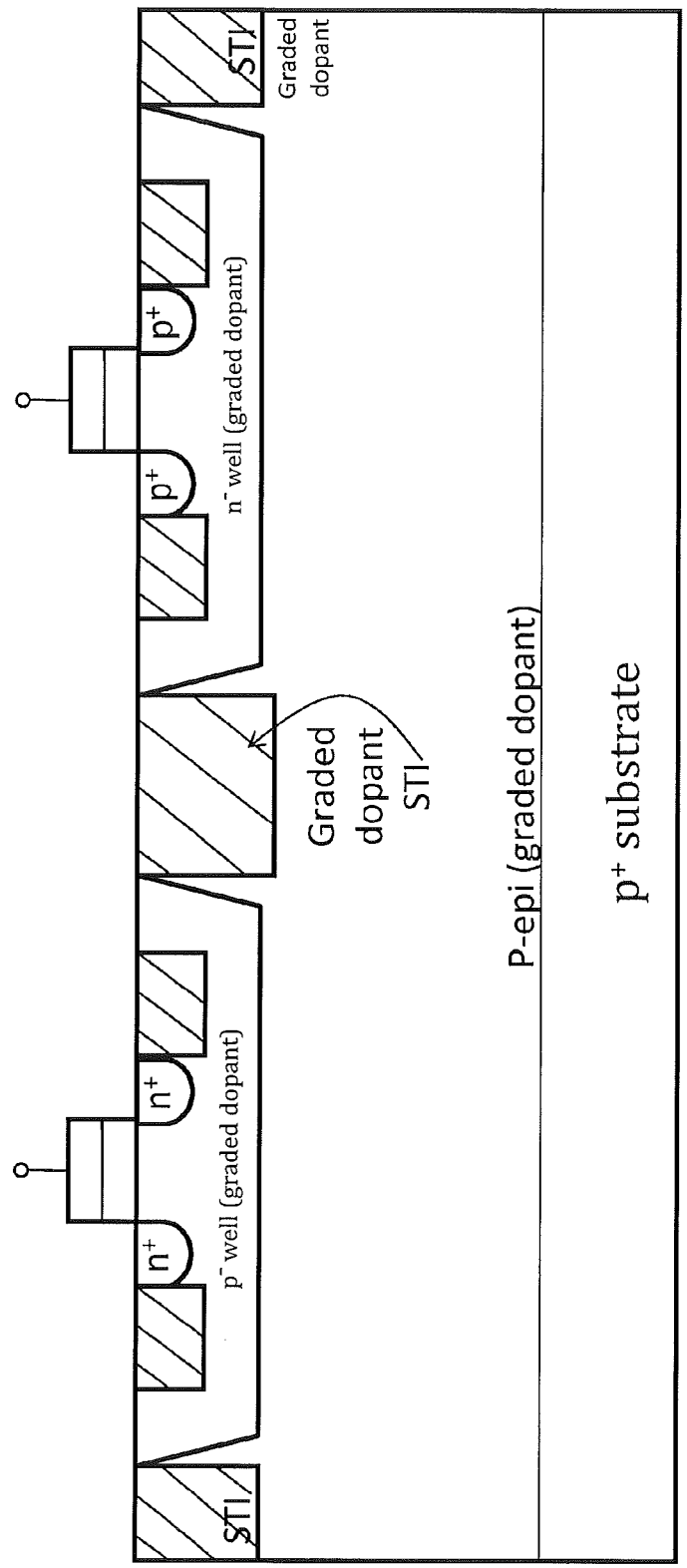
FIG. 7 shows another embodiment using graded dopants to improve the performance characteristics of transistors in a CMOS integrated circuit. Whereas the embodiment in FIG. 6 is fabricated on a uniformly doped "bulk" silicon substrate (as is commonly known in the semiconductor industry), the embodiment of FIG. 7 has an "epitaxial substrate". This epitaxial substrate is approximately 1-3 microns thick and is the top layer for a 50-300 microns thick bulk substrate. Some of the advantages of graded dopant epitaxial silicon is its superior minority carrier lifetime and the creation of an electric field for minority carrier sweep. Superior minority carrier lifetime can enhance refresh time in a DRAM, or reduce programming time in a flash memory. Whereas the wells (both p⁻well and n⁻well) in FIG. 6 are fabricated with graded dopants, the wells in FIG. 7 are fabricated with commonly known practices in the industry. Such commonly known practices may include "halo ion implantations" that are localized in the well regions but they do not constitute "graded dopants" as described in the present disclosure.
Figure 8:
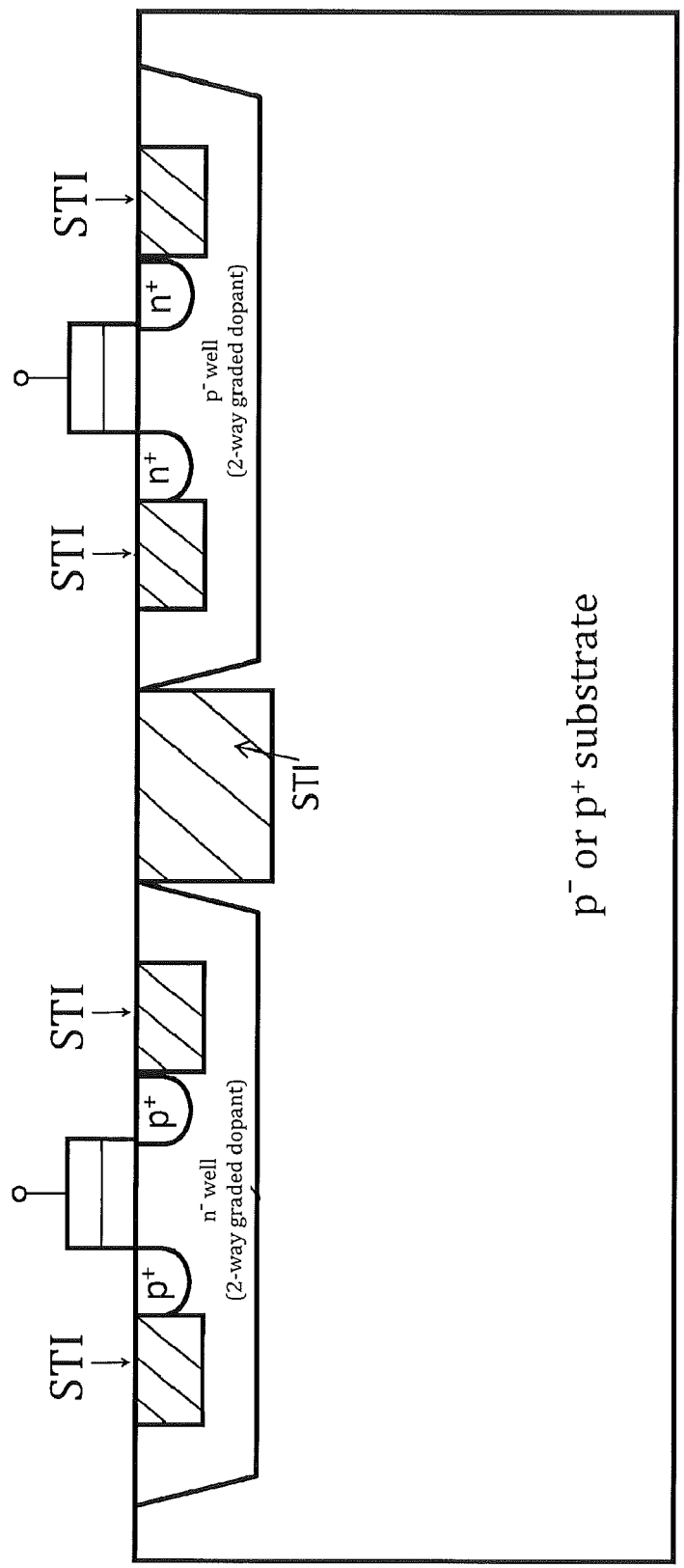
FIG. 8 shows another embodiment practicing the graded dopant invention for a CMOS IC. The wells contain 2-way graded dopant: namely, an "aiding electric field" on the top of the well, and a "retarding electric field" at the bottom of the well. The aiding and retarding electric fields are for the respective minority carriers (holes and electrons).
Figure 9:
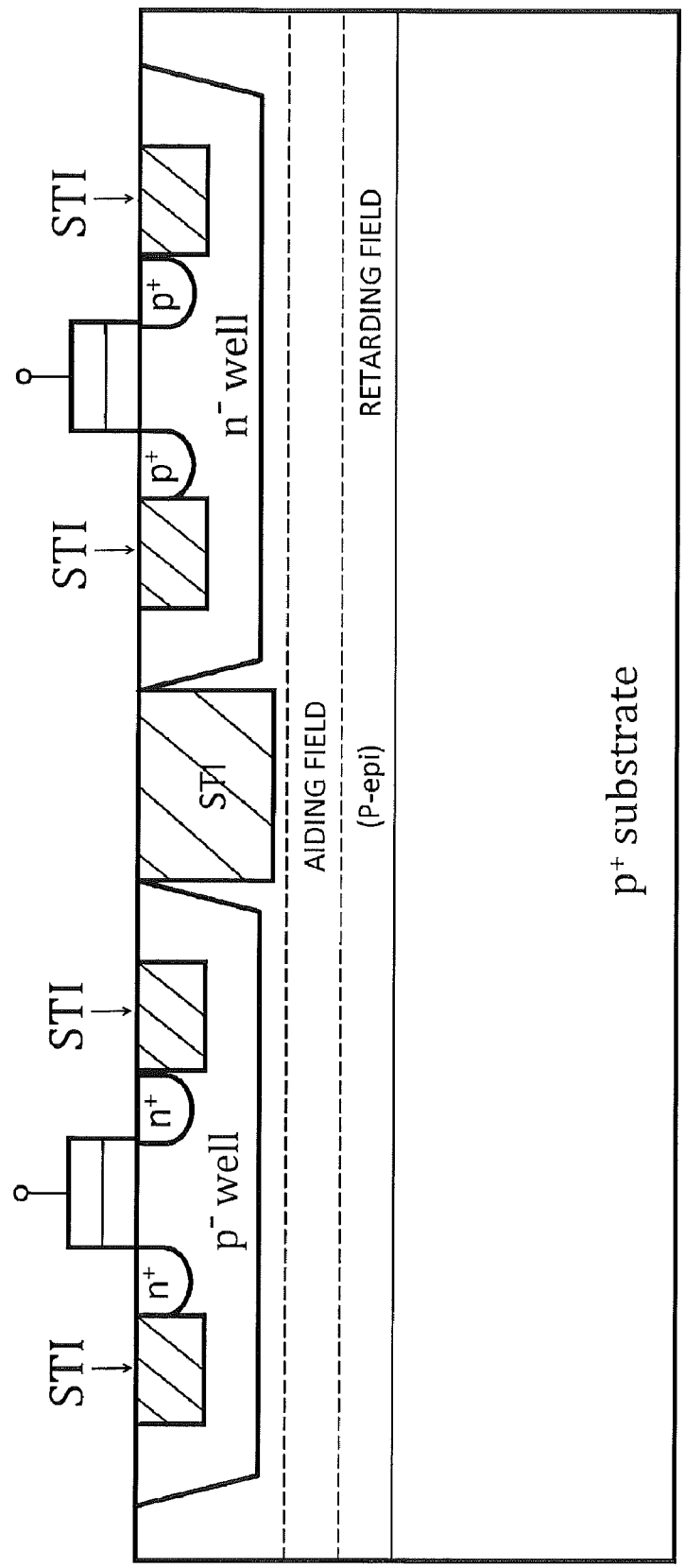
FIG. 9 shows another embodiment practicing the 2-way graded dopant for the epitaxial substrate. The aiding and retarding electric fields can also help sweep minority carriers into the substrate and thus increase immunity to "soft errors". Soft errors due to (transient) radiation is well known in CMOS ICs.
Figure 10:
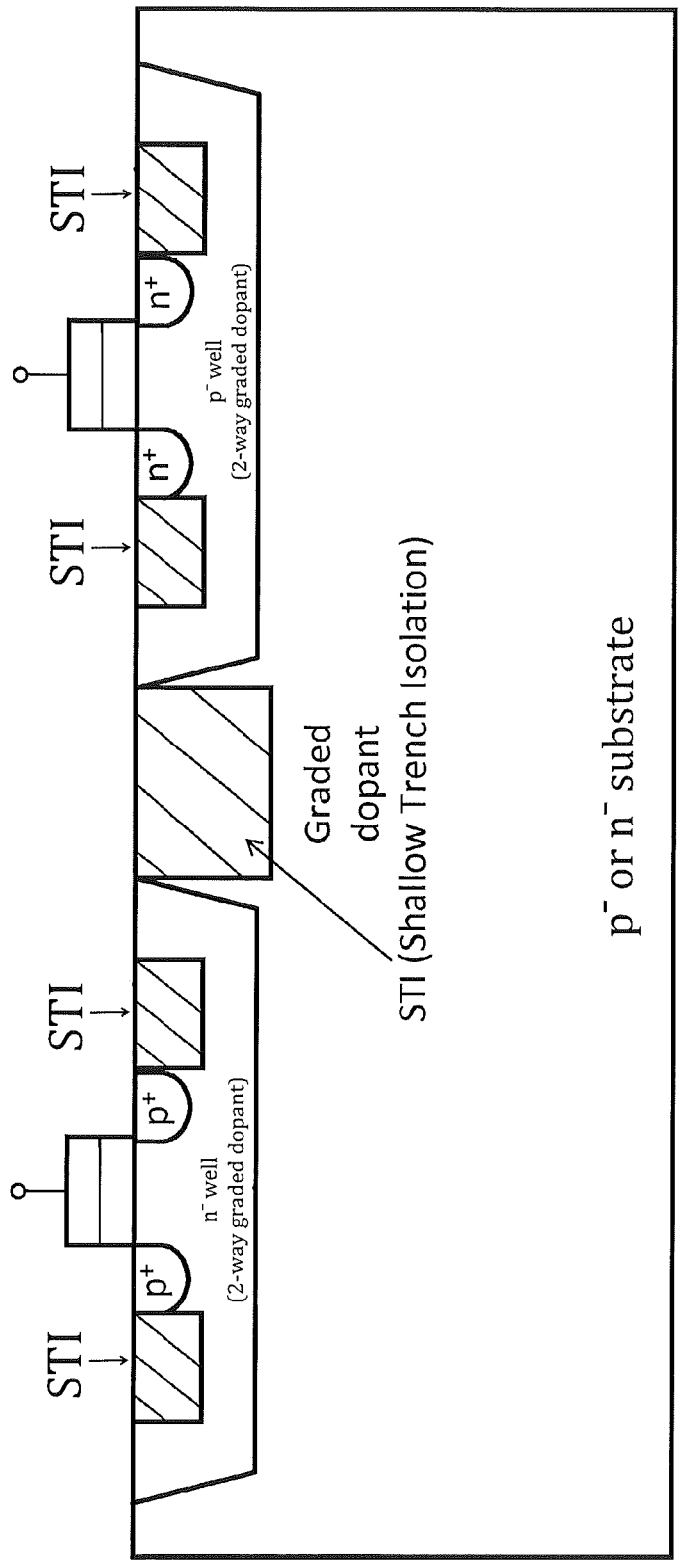
FIG. 10 through FIG. 13 show additional embodiments of the invention.
Figure 11:
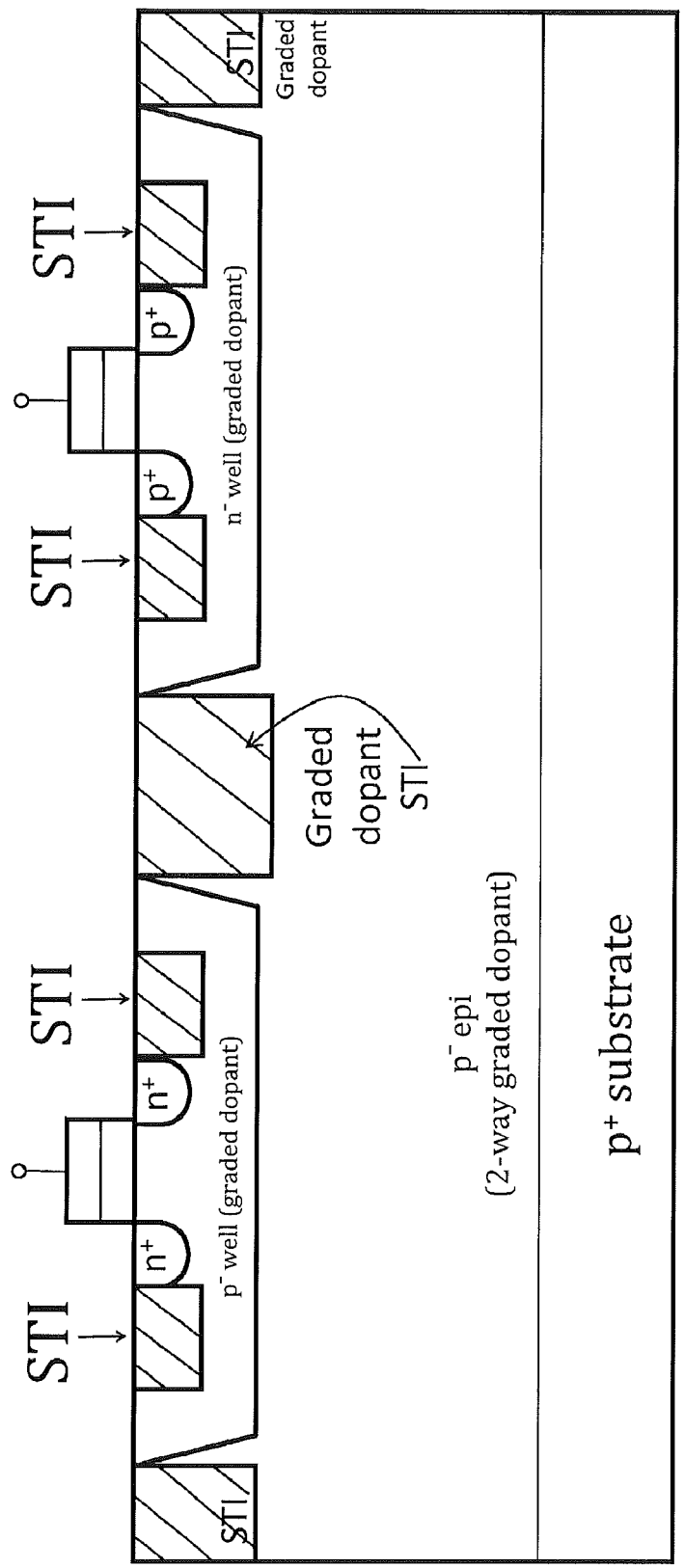
Figure 12:
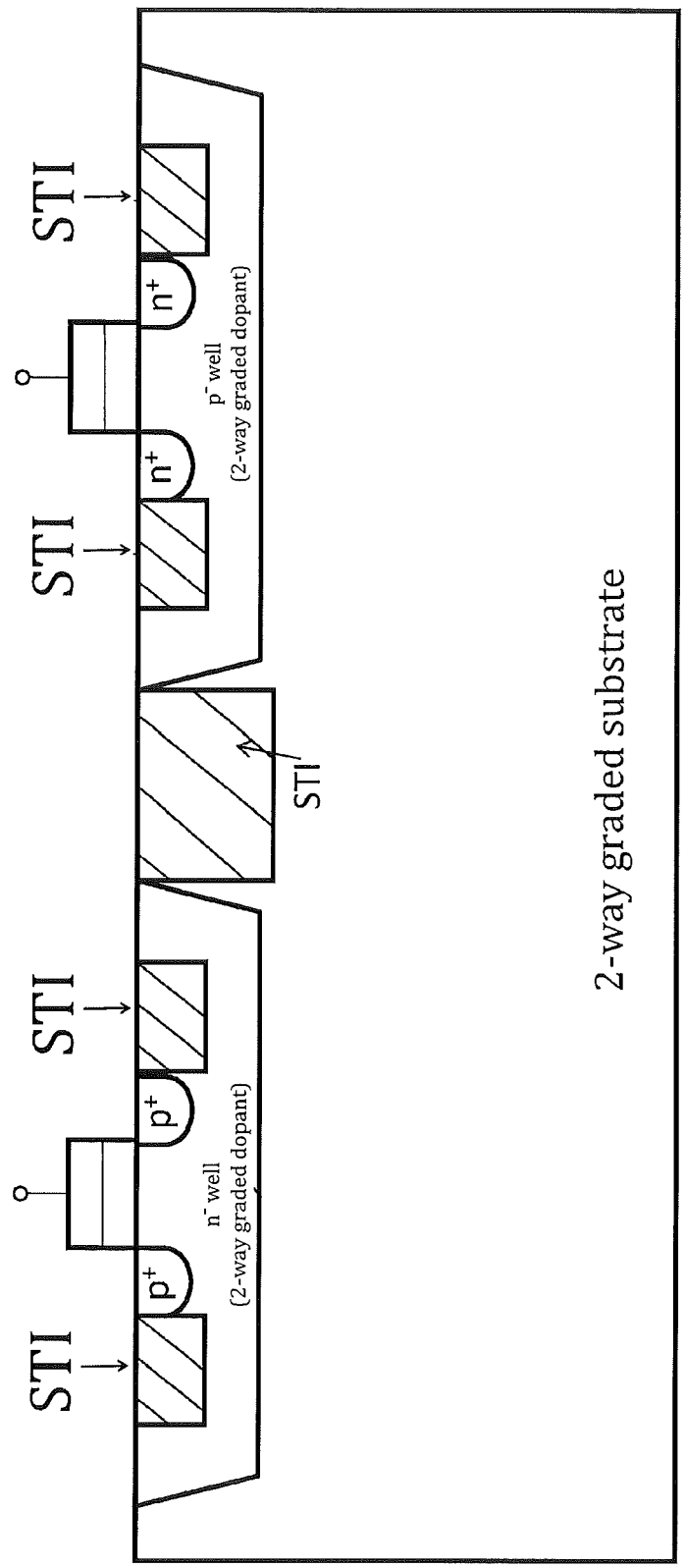
Figure 13:
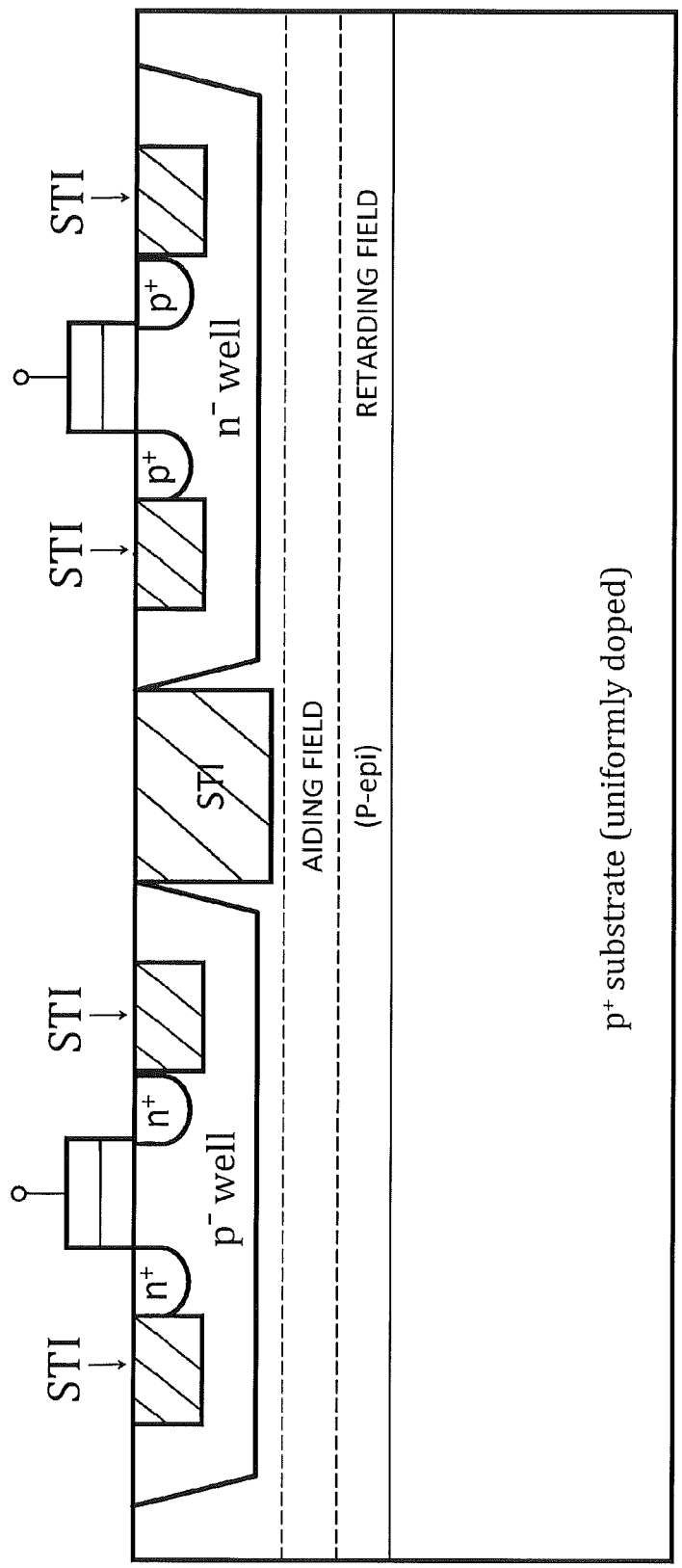
Figure 14:
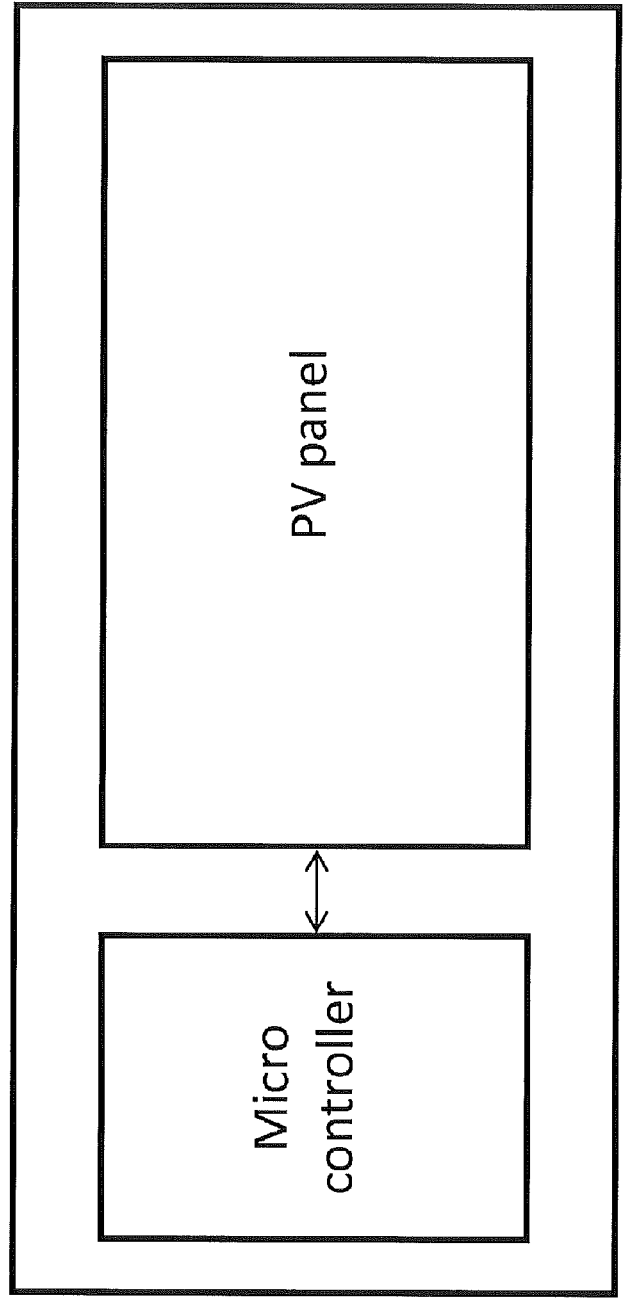
FIG. 14 shows another embodiment where the CMOS IC is a microcontroller mounted on a photovoltaic panel. Both the CMOS controller and the photovoltaic panel are fabricated employing graded dopant concepts described herein. The microcontroller can be used for optimizing power management for the PV panel. The CMOS microcontroller can be entirely powered by the PV panel, which could be operated on solar energy.
Figure 15:
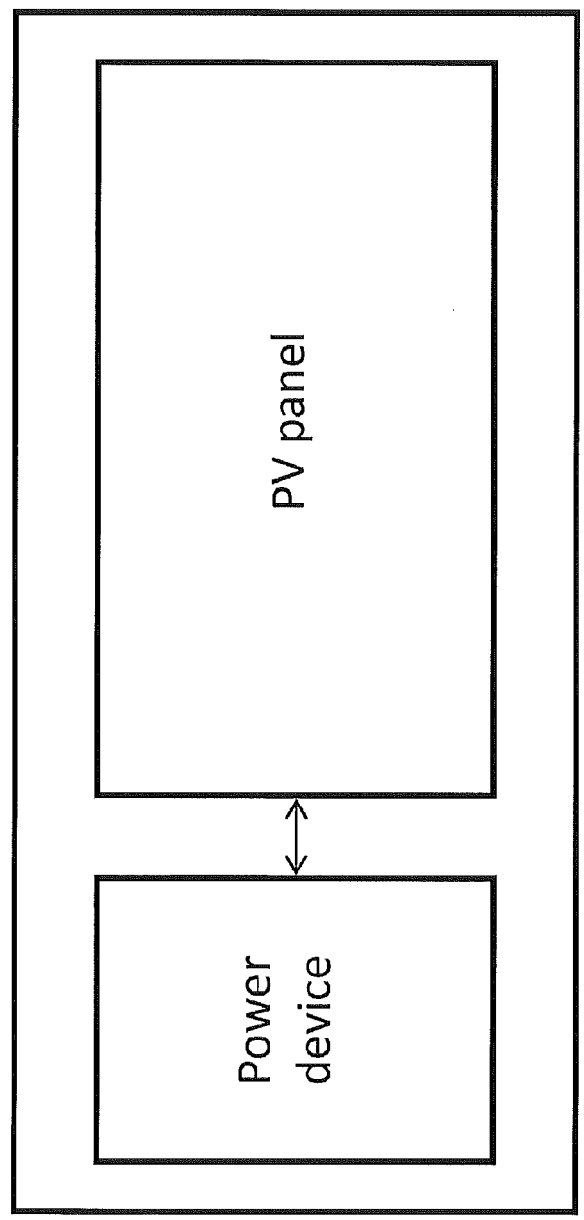
FIG. 15 shows another embodiment where a power device is mounted on the PV panel. The power device can be a "boosting device" (for voltage and/or current) or a "switching device" (like IGBT-insulated gate bipolar transistor) providing dynamic clocked power. This module—PV panel mounted with power device—could be a "solar" to "ac" (alternating current) provider/converter. Both of them employ graded dopants.
Figure 16:
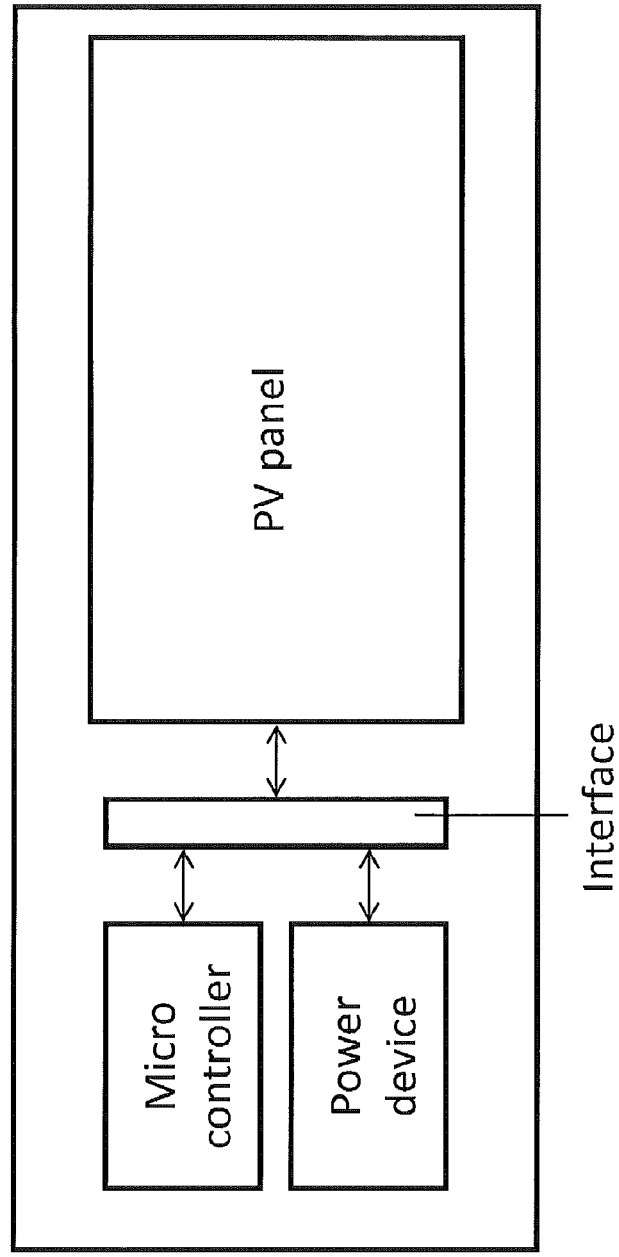
FIG. 16 shows an embodiment where a PV panel, a microcontroller, and a power device—all employing graded dopants—to provide an integrated power conversion module from "solar" to "ac".

As illustrated in FIGS. 5(a), 5(b), and 5(c), donor gradient is also of benefit to very large scale integrated circuits (VLSI)—VLSI logic, DRAM, nonvolatile memory like NAND flash. Spurious minority carriers can be generated by clock switching in digital VLSI logic and memory ICs. These unwanted carriers can discharge dynamically-held "actively held high" nodes. In most cases, statically held nodes (with $V_{cc}$) cannot be affected. Degradation of refresh time in DRAMs is one of the results, because the capacitor holds charge dynamically. Similarly, degradation of CMOS digital images in digital imaging ICs is another result of the havoc caused by minority carriers. Pixel and color resolution can be significantly enhanced in imaging ICs with the embodiments described herein. Creating "subterranean" recombination centers underneath the wells (gold doping, platinum doping) as is done in some high-voltage diodes is not practical for VLSI circuits. Hence, a novel technique is described herein which creates a drift field to sweep these unwanted minority carriers from the active circuitry at the surface into the substrate as quickly as possible. In a preferred embodiment, the subterranean n-layer has a graded donor concentration to sweep the minority carriers deep into the substrate. One or more of such layers can also be implemented through wafer to wafer bonding or similar "transfer" mechanisms. This n-layer can be a deeply-implanted layer. It can also be an epitaxial layer. As desired, the n-well and p-well also can be graded or retrograded in dopants to sweep those carriers away from the surface as well. The graded dopant can also be implemented in surface channel MOS devices to accelerate majority carriers towards the drain. To decrease programming time in nonvolatile memory devices, carriers should be accelerated towards the surface when programming of memory cells is executed. The graded dopant can also be used to fabricate superior Junction Field-Effect transistors where the "channel pinch-off" is controlled by a graded channel instead of a uniformly doped channel (as practiced in the prior art).

One of ordinary skill and familiarity in the art will recognize that the concepts taught herein can be customized and tailored to a particular application in many advantageous ways. For instance, minority carriers can be channeled to the surface to aid programming in nonvolatile memory devices (NOR, NAND, multivalued-cell). Moreover, single-well, and triple-well CMOS fabrication techniques can also be optimized to incorporate these embodiments individually and collectively. Any modifications of such embodiments (described here) fall within the spirit and scope of the invention. Hence, they fall within the scope of the claims described below.

Although the invention has been described with reference to specific embodiments, these descriptions are not meant to be construed in a limiting sense. Various modifications of the disclosed embodiments, as well as alternative embodiments of the invention will become apparent to persons skilled in the art upon reference to the description of the invention. It should be appreciated by those skilled in the art that the conception and the specific embodiment disclosed may be readily utilized as a basis for modifying or designing other structures for carrying out the same purposes of the present invention. It should also be realized by those skilled in the art that such equivalent constructions do not depart from the spirit and scope of the invention as set forth in the appended claims.

It is therefore, contemplated that the claims will cover any such modifications or embodiments that fall within the true scope of the invention.

What is claimed is:

1. A CMOS IC device comprising:
   a non-epitaxial substrate having a surface area;
   a plurality of well regions fabricated on said non-epitaxial substrate and arranged in said surface area, each one of said plurality of well regions comprising 2-way graded dopants disposed therein and at least one of said plurality of well regions further comprising at least one first isolation region disposed therein;
   at least one second isolation region fabricated on said non-epitaxial substrate separating said plurality of well regions; and
   wherein in each one of said plurality of well regions said 2-way graded dopants create a plurality of electric fields for aiding the movement of a first plurality of carriers up towards said surface area and a second plurality of carriers down towards said substrate.

2. The CMOS IC device of claim 1 wherein any one of said first isolation region and said second isolation region is a Shallow Trench Isolation.

3. The CMOS IC device of claim 1 wherein said non-epitaxial substrate is a $p^-$ or $p^+$ substrate.

4. The CMOS IC device of claim 1 wherein said non-epitaxial substrate is an $n^-$ substrate.

5. A CMOS IC device comprising:
   a non-epitaxial substrate having a surface area;
   a plurality of well regions fabricated on said non-epitaxial substrate and arranged in said surface area, each one of said plurality of well regions comprising 2-way graded dopants creating a first electric field disposed at the top of the well for aiding the movement of a first plurality of carriers to said top of the well and a second electric field disposed at the bottom of the well for aiding the movement of a second plurality of carriers to said bottom of the well and at least one of said well regions further comprising at least one first isolation region disposed therein; and
   at least one second isolation region fabricated on said non-epitaxial substrate separating said plurality of well regions.

6. The CMOS IC device of claim 5 wherein any one of said first isolation region and said second isolation region is a Shallow Trench Isolation.

7. The CMOS IC device of claim 5 wherein said non-epitaxial substrate is a $p^-$ or $p^+$ substrate.

8. The CMOS IC device of claim 5 wherein said non-epitaxial substrate is an $n^-$ substrate.

9. The CMOS IC device of claim 5 wherein said non-epitaxial substrate also comprises 2-way graded dopants creating a third electric field disposed near the top of the substrate for aiding the movement of a third plurality of carriers to said top of the substrate and a fourth electric field at the bottom of the substrate for aiding the movement of a fourth plurality of carriers to said bottom of the substrate.

10. A CMOS IC device comprising:
    a uniformly doped non-epitaxial substrate;
    an epitaxial layer fabricated onto said non-epitaxial substrate, said epitaxial layer comprising graded dopants and a surface area;
    a plurality of well regions fabricated on said epitaxial layer and arranged in said surface area, each one of said plurality of well regions having 2-way graded dopants and at least one of said plurality of well regions further comprising at least one first isolation region disposed within said at least one well region;
    at least one second isolation region fabricated on said epitaxial layer separating said plurality of well regions; and
    wherein in each one of said plurality of well regions said 2-way graded dopants create a plurality of electric fields for aiding the movement of a first plurality of carriers up towards said surface area and a second plurality of carriers down towards said substrate.

11. The CMOS IC device of claim 10 wherein any one of said first isolation region and said second isolation region is a Shallow Trench Isolation.

12. A CMOS IC device comprising:
    a non-epitaxial substrate;
    a 2-way graded dopant epitaxial layer fabricated onto said non-epitaxial substrate, said epitaxial layer having a surface area and said epitaxial layer further comprising a first electric field disposed at the top of said epitaxial layer for aiding the movement of carriers to said top of said epitaxial layer and a second electric field disposed at the bottom of said epitaxial layer for aiding the movement of carriers to said bottom of said epitaxial layer;
    a plurality of well regions fabricated on said epitaxial layer and arranged in said surface area, each one of said plurality of well regions having 2-way graded dopants and at least one of said plurality of well regions further comprising at least one first isolation region disposed within said at least one well region;
    at least one second isolation region fabricated on said epitaxial layer separating said plurality of well regions; and
    wherein in each one of said plurality of well regions said 2-way graded dopants create a plurality of electric fields for aiding the movement of a first plurality of carriers up towards said surface area and a second plurality of carriers down towards said substrate.

13. The CMOS IC device of claim 12 wherein any one of said first isolation region and said second isolation region is a Shallow Trench Isolation.

14. The CMOS IC device of claim 12 wherein said non-epitaxial substrate is a $p^+$ substrate.

15. The CMOS IC device of claim 12 wherein said non-epitaxial substrate is a uniformly doped substrate.

16. The CMOS IC device of claims 1, 5, 10 or 12 wherein said first and second plurality of carriers are minority carriers.

17. The CMOS IC device of claims 1, 5, 10; or 12 wherein said first and second plurality of carriers are majority carriers.

18. The CMOS IC device of claims 1, 5, 10; or 12 wherein said first plurality of carriers are minority carriers and said second plurality of carriers are majority carriers.

19. The CMOS IC device of claim 9 wherein said first and second plurality of carriers are minority carriers.

20. The CMOS IC device of claim 9 wherein said first and second plurality of carriers are majority carriers.

21. The CMOS IC device of claim 9 wherein said first plurality of carriers are minority carriers and said second plurality of carriers are majority carriers.

* * * * *